(12) United States Patent
Duperray (10) Patent No.: US 7,786,806 B2
(45) Date of Patent: Aug. 31, 2010

(54) TUNABLE CASCODE LNA WITH FLAT GAIN RESPONSE OVER A WIDE FREQUENCY RANGE

(75) Inventor: David Duperray, Redwood City, CA (US)

(73) Assignee: NXP B.V., Eindhoven (NL)

( * ) Notice: Subject to any disclaimer, the term of this patent is extended or adjusted under 35 U.S.C. 154(b) by 57 days.

(21) Appl. No.: 11/575,065

(22) PCT Filed: Sep. 8, 2005

(86) PCT No.: PCT/IB2005/052945

§ 371 (c)(1),
(2), (4) Date: Mar. 9, 2007

(87) PCT Pub. No.: WO2006/027755

PCT Pub. Date: Mar. 16, 2006

(65) Prior Publication Data

US 2008/0012643 A1    Jan. 17, 2008

Related U.S. Application Data

(60) Provisional application No. 60/608,807, filed on Sep. 10, 2004, provisional application No. 60/648,800, filed on Jan. 31, 2005.

(51) Int. Cl.
*H03F 3/04* (2006.01)

(52) U.S. Cl. ........................................ 330/311; 330/302

(58) Field of Classification Search ................. 330/302, 330/305, 31, 311
See application file for complete search history.

(56) References Cited

U.S. PATENT DOCUMENTS

| | | | | |
|---|---|---|---|---|
| 3,435,358 | A * | 3/1969 | Rheinfelder | ................. 330/297 |
| 4,277,757 | A * | 7/1981 | Kennedy | .................... 330/300 |
| 4,845,445 | A | 7/1989 | Rinderlet | |
| 5,339,048 | A | 8/1994 | Weber | |
| 5,502,420 | A | 3/1996 | Barclay | |
| 5,929,707 | A * | 7/1999 | Samuels | ..................... 330/283 |
| 6,204,728 | B1 | 3/2001 | Hageraats | |
| 6,681,103 | B1 | 1/2004 | Rogers et al. | |
| 6,806,777 | B2 * | 10/2004 | Franca-Neto | ................ 330/311 |
| 7,323,939 | B2 * | 1/2008 | Han et al. | .................... 330/311 |
| 2003/0112078 | A1 | 6/2003 | Rategh | |

FOREIGN PATENT DOCUMENTS

| | | |
|---|---|---|
| EP | 0831584 A | 3/1998 |
| GB | 0 773 548 | 4/1957 |

OTHER PUBLICATIONS

Ismail, A.; Abidi, A, "A 3 to 10GHz LNA Using a Wideband LC-ladder Matching Network", Digest of Technical Papers, IEEE International Solid-State Circuits Conference (ISSCC), Feb. 2004, San Francisco, California.

(Continued)

*Primary Examiner*—Michael B Shingleton (57) ABSTRACT

A cascode LNA circuit is provided with a tuned inductive load. The circuit shows a flat response over a wide frequency range.

20 Claims, 6 Drawing Sheets

OTHER PUBLICATIONS

Bevilacqua, A.; Niknejad, A.M.,"An Ultra-Wideband CMOS LNA for 3.1 to 10.6GHz Wireless Receivers", Digest of Technical Papers, IEEE International Solid-State Circuits Conference (ISSCC), Feb. 2004, San Francisco, California.

Zargari, M.; Jen, S.; Kaczynski, B.; Lee, M.; Mack, M.; Mehta, S.; Mendis, S.; Onodera, K.; Samavati, H.; Si, W.; Singh, K.; Tabatabaei, A.; Terrovitis, M.; Weber, D.; Su, D.; Wooley, B..,"A Single-Chip Dual-Band Tri-Mode CMOS Transceivers for IEEE 802.11a/b/g WLAN", Digest of Technical Papers, IEEE International Solid-State Circuits Conference (ISSCC), Feb. 2004, San Francisco, California.

Rossi, P.; Liscidini, A.; Brandolini, M., Svelto, F, "A 2.5dB NF Direct-Conversion Receiver Front-End for HiperLAN2/IEEE802.11a", Digest of Technical Papers, IEEE International Solid-State Circuits Conference (ISSCC), Feb. 2004, San Francisco, California.

Macedo, J. et al. "A 1.9 GHz Silicon Receiver with On-Chip Image Filtering", IEEE 1997 Custom Integrated Circuits Conf., pp. 181-84 (May 1997).

International Preliminary Report on Patentability for Int'l Patent Appln. PCT/IB2005/052945 (Mar. 13, 2007).

* cited by examiner

TUNABLE CASCODE LNA WITH FLAT GAIN RESPONSE OVER A WIDE FREQUENCY RANGE

CROSS REFERENCE TO RELATED APPLICATION

This application claims the benefit of U.S. provisional application Ser. No. 60/608,807 filed Sep. 10, 2004, and Ser. No. 60/648,800 filed on Jan. 31, 2005 which is incorporated herein whole by reference.

Today, many wireless systems use a cascode LNA (Low Noise Amplifier) in the receiver chain. The advantages of such a structure compared to a single transistor stage are well known: good reverse isolation which makes the input impedance matching network almost independent of the LNA load and reduces significantly any leakage from the LO (Local Oscillator). More and more wireless systems are operating over a wide frequency range: for 802.11a, the frequency of operation is from 4.9 GHz to 6.0 GHz and for UWB, the band of operation covers several GHz. The LNA, which is the first stage of a receiver chain (after the antenna(s) and the front-end filter(s) if any) needs to provide a high enough gain and a low noise figure over the frequency of operation.

The following references are believed to be illustrative of the state of the art:

[1] "A 3 to 10 GHz LNA using wideband LC-Ladder Matching Network", A. Ismail, A. Abidi, ISSCC 2004 conference.

[2] "An ultra-wideband CMOS LNA for 3.1 to 10.6 GHz Wireless Receivers", Andrea Bevilacqua, Ali M Niknejad, ISSCC 2004 conference.

[3] "A single-chip dual-band tri-mode CMOS transceivers for IEEE 802.11a/b/g WLAN" Masoud Zargari and al, ISSCC 2004 conference.

[4] "A 2.5 dB NF direct-conversion receiver front-end for HiperLAN2/IEEE802.11a" Paola Rossi, Antonio Liscidini, Massimo Brandolini, Francesco Svelto, ISSCC 2004 conference.

Figure 1:
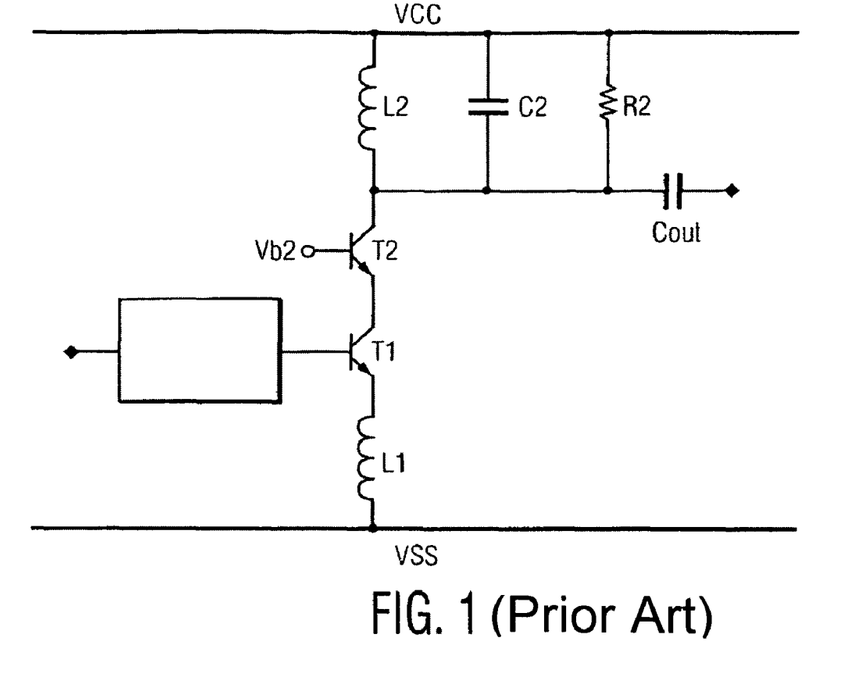
FIG. 1 is a simplified circuit diagram of a typical cascode LNA.

Recently, the cascode LNA circuit has been seen in many papers [1], [2], [3]. Referring to FIG. 1, a typical bipolar cascode LNA used for 802.11a and UWB (or any other wireless system) has the following structure: input matching network (N1), trans-conductance stage (T1), inductive emitter degeneration (L1), common-base (T2), inductive load (L2), with optional components are C2 and R2. The biasing circuits for transistors T1 and T2 are not detailed in the FIG. 1 for simplicity of the drawings.

A corresponding structure can also be realized in CMOS technology.

Figure 2:
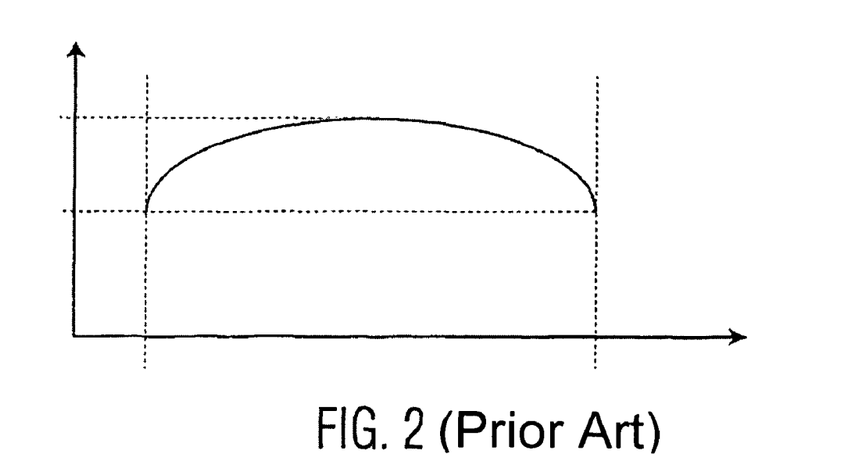
FIG. 2 a diagram showing the typical frequency response of a cascode LNA with inductive load over a wide frequency of operation.

Referring to FIG. 2, a significant disadvantage of the cascode structure with an inductive load of FIG. 1 is its gain variation over the operating frequency band Fstop-Fstart. Typically, Fstop-Fstart>1 GHz.

One way to make the cascode LNA gain flat over a wide frequency range is by using advanced input matching networks as in [1] and [2]. However, a very wideband LNA has the main disadvantage of amplifying the wanted received signal, at frequency Fwanted (between Fstart and Fstop), but also any other interferers at different frequencies than Fwanted (even is Fintereferer is far away from Fwanted). Amplifying interferers is not acceptable since it requires extra dynamic range and extra filtering in the receiver chain, which translates to increased current consumption and cost (in case of adding extra passive filters at the antenna front-end).

Figure 3:
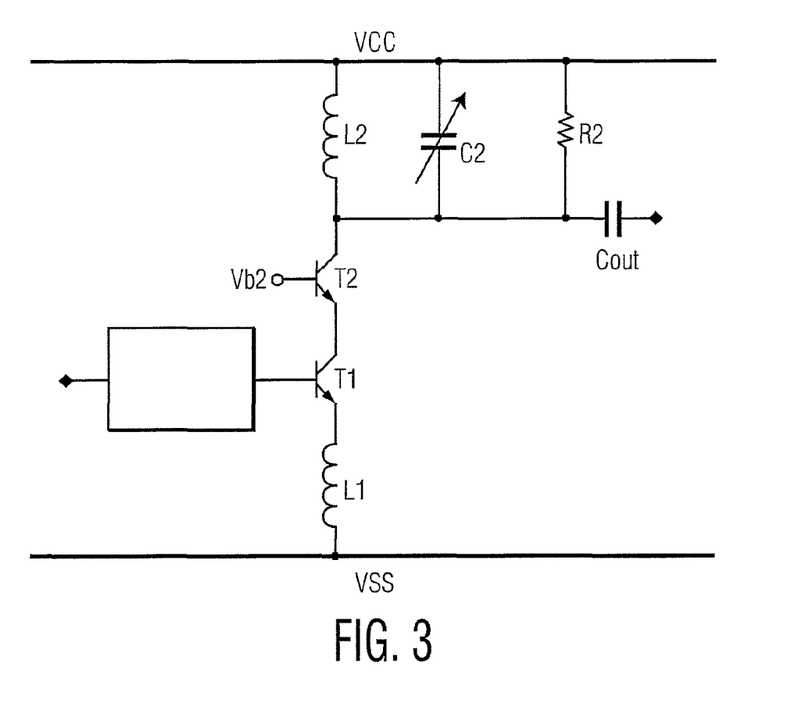
FIG. 3 is a simplified circuit diagram of a cascode LNA with tunable inductive load.

To solve the issue of a very wideband LNA (which amplifies even out of band interferers), one approach is to frequency tune a narrow band LNA. Referring to FIG. 3, this is done easily by tuning the inductive load with a variable capacitor. By frequency tuning a narrow band LNA it becomes possible to cover a wide range of operating frequencies. This concept has already been implemented and published in [4]. However the circuit proposed in this paper has several disadvantages: the LNA is not a cascode but a common base stage which has poor LO leakage; the frequency response is not flat: the presented paper [4] shows about 1 dB gain variation.

Figure 4:
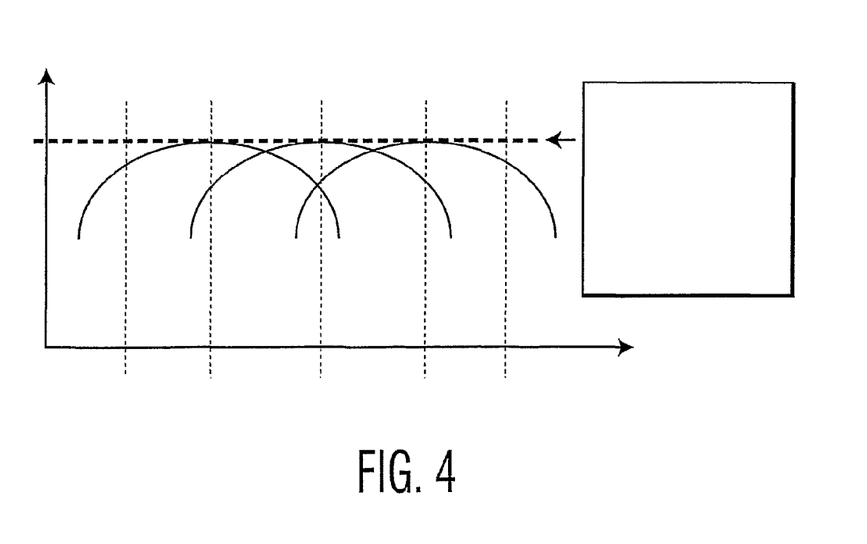
FIG. 4 is a diagram showing the ideal frequency response of a tuned LNA.
Figure 5:
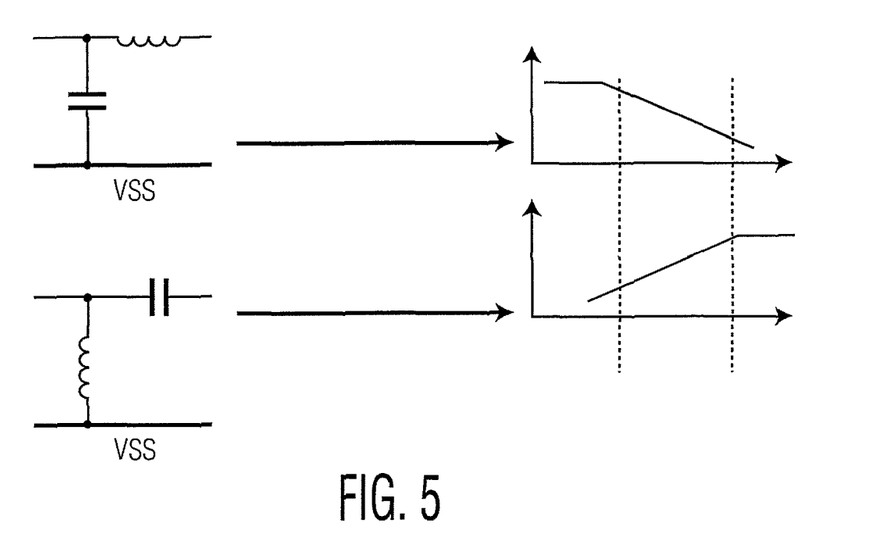
FIG. 5 is a diagram showing typical input matching networks and their frequency responses.

FIG. 4, illustrates the ideal desired response of a cascode LNA with a tunable inductive load. Because of the foregoing gain variation, however, a real circuit does not have the ideal response as shown in FIG. 4. Rather, the gain values at tune frequencies Ftune1, 2, 3 . . . are not the same. The frequency response from the input of the transconductance stage T1 to the LNA output (see FIG. 1) may be quite close to what is shown in FIG. 4. Nevertheless, referring to FIG. 5, the frequency response of the input matching network (FIG. 1) is not flat over a wide band. In consequence, the overall LNA response as described in FIG. 3 is actually shaped by the input matching network frequency response (see FIG. 6).

Figure 6:
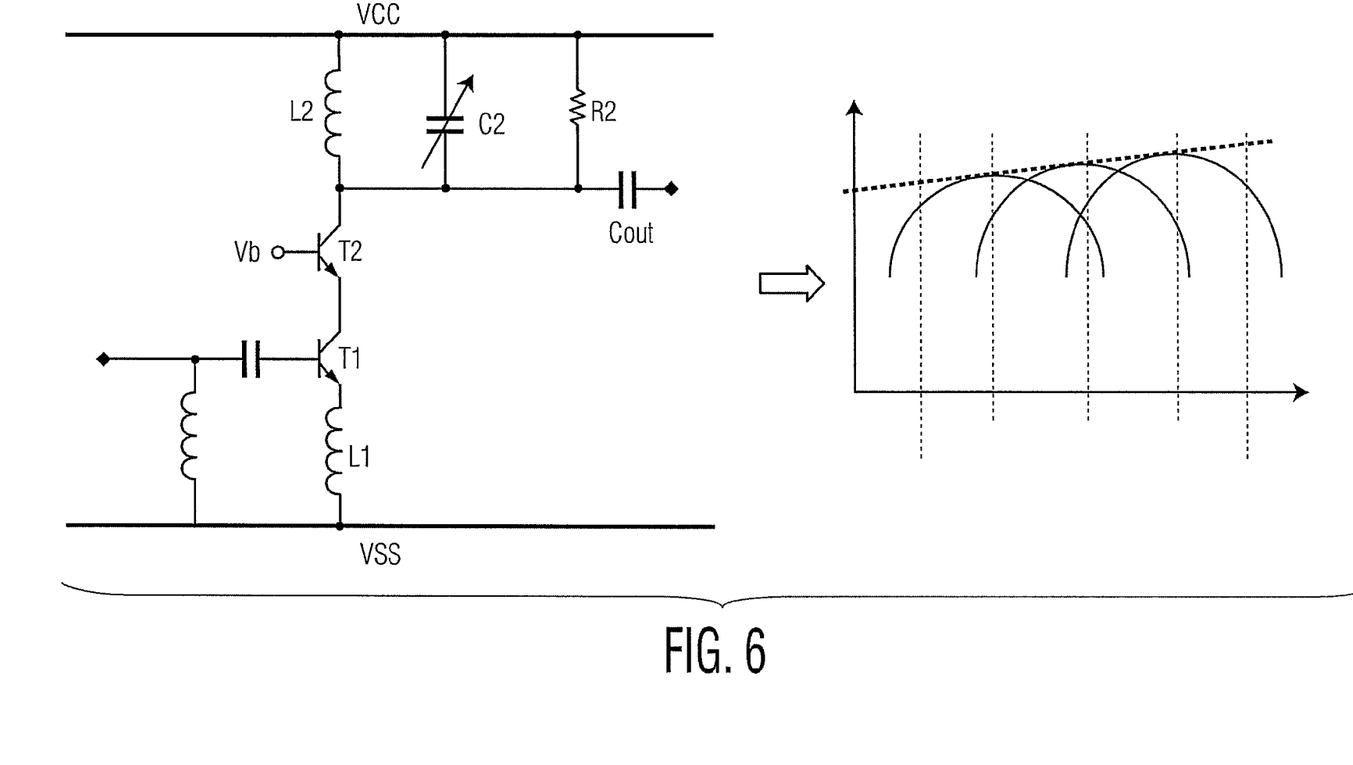
FIG. 6 is a diagram of a cascode LNA with tuned inductive load and its frequency response, shaped by its matching network frequency response.

From FIG. 6, it may be seen that a cascode LNA circuit with inductive load tuning does not have a flat response over the operating frequency range Fstop-Fstart as desired in a wireless system (see FIG. 4).

The present invention, generally speaking, provides for a cascode LNA circuit with a tuned inductive load. The circuit shows a flat response over a wide frequency range.

Figure 7:
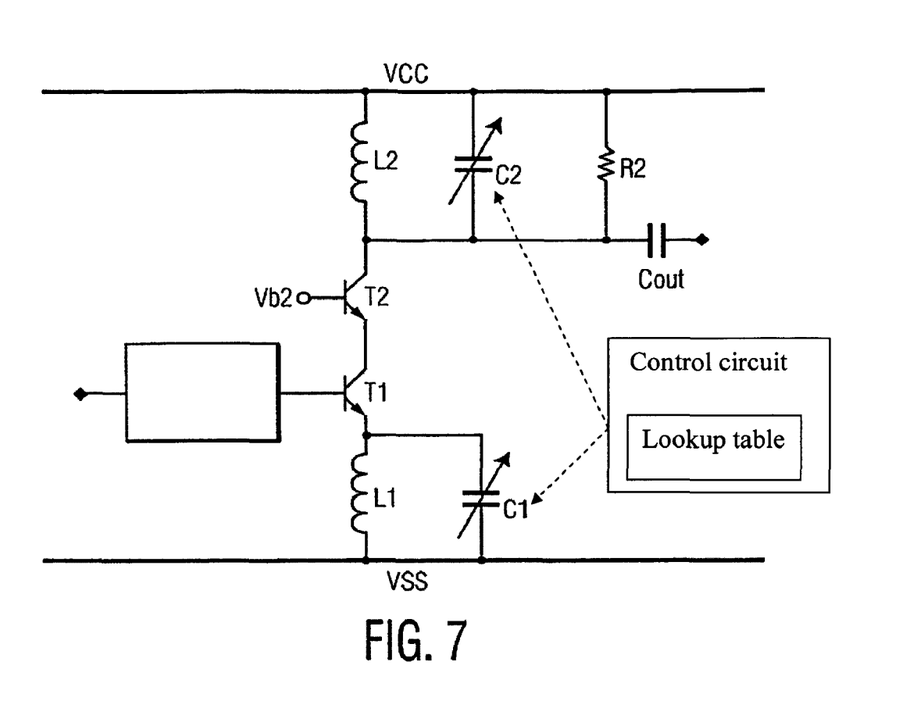
FIG. 7 is a simplified circuit diagram of a cascode LNA with tuned inductive load and tuned inductive emitter degeneration in accordance with one embodiment of the present invention.

Referring now to FIG. 7, a simplified circuit diagram is shown of a cascode LNA with a tuned inductive load including a tuned emitter degeneration inductor L1. The inductor L1 functions to linearize the transconductance of the circuit. The resistor R2 is optional in this circuit.

Figure 8:
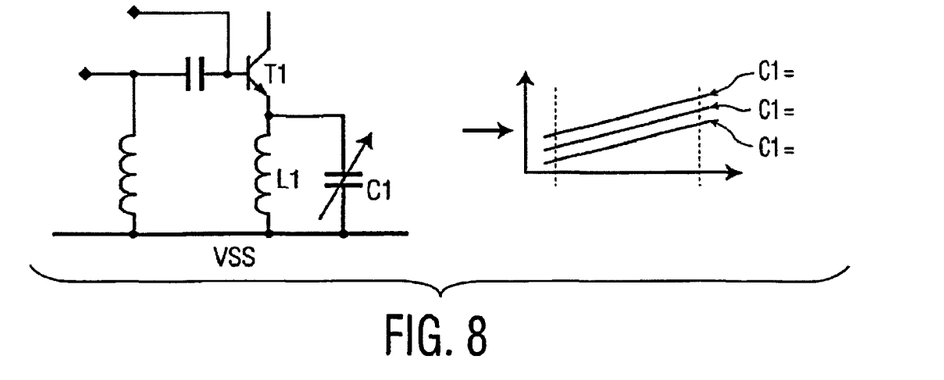
FIG. 8 is a diagram of the trans-conductor stage with input matching network and tuned inductive emitter degeneration and its frequency response for different tuning values.

By tuning the degeneration inductor L1 by capacitor C1, it becomes easy to frequency compensate the input matching network as shown in FIG. 8. The LNA gain is now tunable using emitter degeneration inductor tuning.

Figure 9:
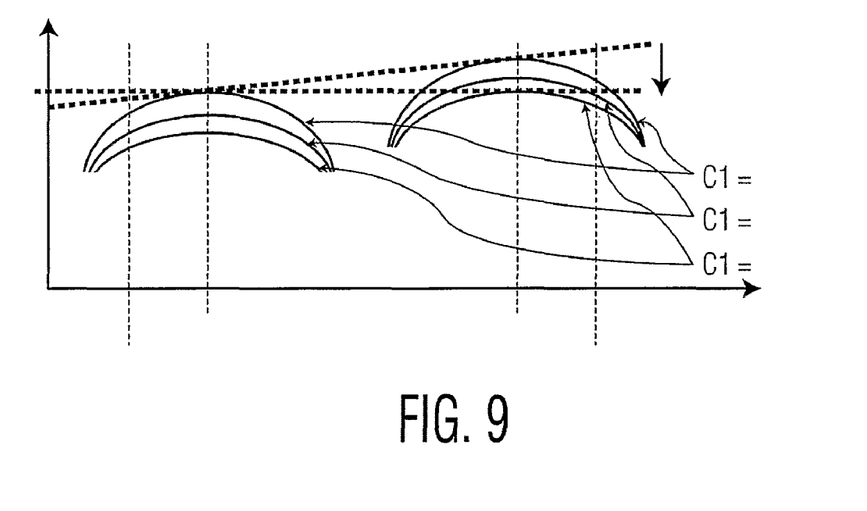
FIG. 9 is a diagram of the frequency response of the cascode LNA of FIG. 7 when the inductive load and the inductive degeneration are both tuned.

Referring to FIG. 9, it may be seen that the LNA gain can be made substantially flat (in an exemplary embodiment, <1 dB variation from 4.9 GHz to 6 GHz) over the operating frequency band Fstop-Fstart by proper combination of C1 and C2 values (the emitter degeneration inductor tuning capacitor and load inductor tuning capacitor, respectively). The values of C1 and C2 may be controlled using a control circuit including a lookup table, for example, giving values of C1 and C2 for different wanted frequencies.

Figure 10:
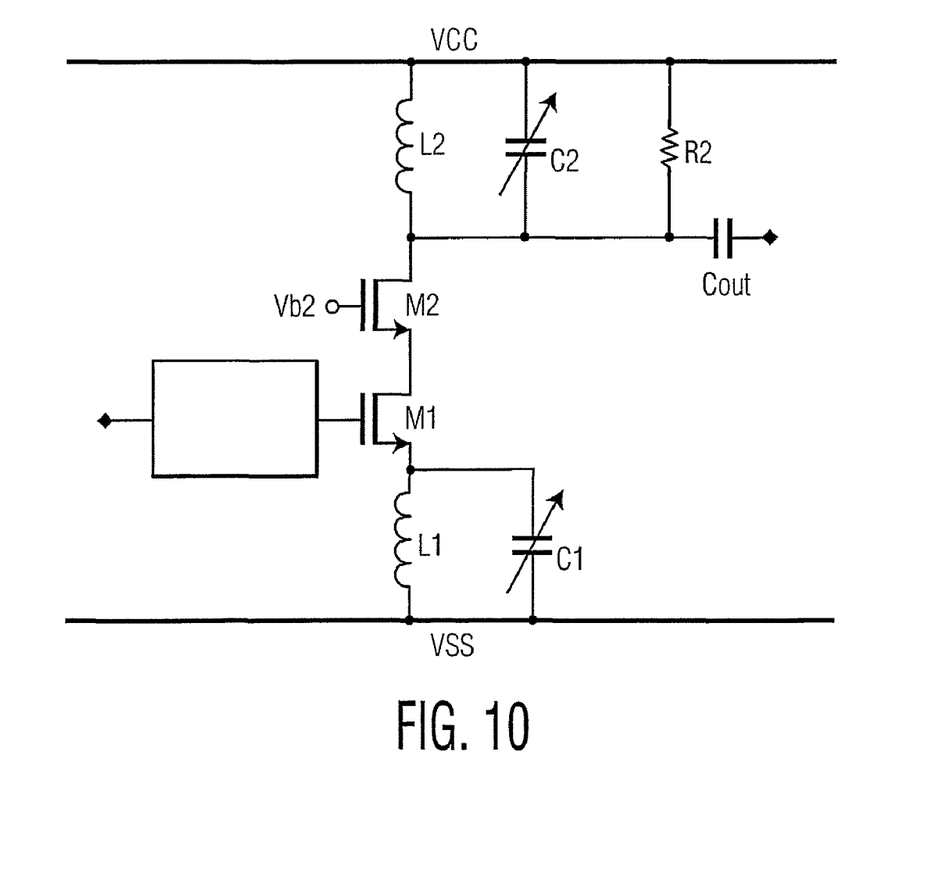
FIG. 10 is a simplified circuit diagram of a CMOS cascode LNA with tuned inductive load and tuned inductive emitter degeneration in accordance with another embodiment of the present invention.

Referring to FIG. 10, a simplified circuit diagram is shown of a CMOS cascode LNA with a tuned inductive load including a tuned emitter degeneration inductor.

It will be appreciated by those of ordinary skill in the art that the present invention can be embodied in other specific forms without departing from the spirit or essential character thereof. The disclosed embodiments are therefore intended in all respects to be illustrative and not restrictive. The scope of the invention is indicated by the appended claims and not by the foregoing description, and all changes which come within the meaning and range of equivalents thereof are intended to be embraced therein.

What is claimed is:

1. A method of amplifying a received input signal with substantially constant gain over a wide frequency range, comprising:
   tuning a narrow-band cascode amplifier to amplify the received input signal only if the received input signal is within a selected partial frequency range of the wide frequency range corresponding to a signal of interest using a first variable capacitor element coupled in parallel with an inductive load, the first variable capacitor element and the inductive load being connected to a transistor of the narrow-band cascode amplifier, wherein the tuning comprises varying the first variable capacitor element using predefined values of the first variable capacitor that are stored in a control circuit; and
   compensating a non-linear gain response of the narrow-band amplifier according to the selected partial frequency range to achieve the substantially constant gain using a second variable capacitor element coupled in parallel with an inductor, the second variable capacitor element and the inductor being connected to another transistor of the narrow-band cascode amplifier, wherein the compensating comprises varying the second variable capacitor element using predefined values of the second variable capacitor that are stored the control circuit in a coordinated manner with the varying of the first variable capacitor element.

2. An amplifier circuit for amplifying a received input signal with substantially constant gain over a wide frequency range, comprising:
   a narrow-band cascode amplifier;
   means for tuning the narrow-band amplifier to amplify the received input signal only if the received input signal is within a selected partial frequency range of the wide frequency range corresponding to a signal of interest, the means for tuning comprising a first variable capacitor element coupled in parallel with an inductive load;
   means for compensating a non-linear gain response of the narrow-band amplifier according to the selected partial frequency range to achieve the substantially constant gain, the means for compensating comprising a second variable capacitor element coupled in parallel with an inductor; and
   a control circuit for adjusting both the first variable capacitor and the second variable capacitor in a coordinated manner, wherein the control circuit includes a lookup table configured to store predefined values of the first variable capacitor element and the second variable capacitor element.

3. An amplifier circuit for amplifying an input signal with substantially constant gain over a wide frequency range, the amplifier circuit comprising:
   a narrow-band cascode amplifier, wherein the narrow-band cascode amplifier comprises a first transistor and a second transistor, the first and second transistors being coupled to the input signal and an output signal;
   a power supply coupled to a first terminal of the first transistor;
   a matching network coupled to a first terminal of the second transistor and causing the output signal to exhibit a frequency-dependent gain;
   a first variable capacitor for tuning the narrow-band cascode amplifier to amplify the input signal only if the input signal is within a selected partial frequency range of the wide frequency range, wherein the first variable capacitor is coupled in parallel with a conduction path of the first transistor, the first variable capacitor and the conduction path of the first transistor being connected to a second terminal of the first transistor, a third terminal of the first transistor being connected to a second terminal of the second transistor;
   a second variable capacitor for varying the gain of the amplifier circuit coupled in parallel with a transconductance linearizing element to achieve a substantially constant gain, wherein the second variable capacitor and the transconductance linearizing element is connected to a third terminal of the second transistor; and
   a control circuit for adjusting both the first variable capacitor and the second variable capacitor in a coordinated manner to counteract said frequency-dependent gain, wherein the control circuit includes a lookup table configured to store predefined values of the first variable capacitor and the second variable capacitor to counteract said frequency-dependent gain.

4. The amplifier circuit of claim 3, wherein the matching network includes an inductor and a capacitor.

5. The amplifier circuit of claim 2, wherein the narrow-band cascode amplifier comprises a common-base bipolar transistor of NPN type and a transconductance stage bipolar transistor of NPN type, the emitter of the common-base bipolar transistor being connected to the collector of the transconductance stage bipolar transistor.

6. The amplifier circuit of claim 5, wherein the first variable capacitor element and the inductive load is connected to the collector of the common-base bipolar transistor, and the second variable capacitor element and the inductor is connected to the emitter of the transconductance stage bipolar transistor.

7. The amplifier circuit of claim 3, wherein the lookup table stores the predefined values of the first variable capacitor and the second variable capacitor for different operating frequencies.

8. The amplifier circuit of claim 7, wherein the amplifier circuit is a part of a receiver chain in a wireless system.

9. The amplifier circuit of claim 8, wherein the narrow-band cascode amplifier comprises a common-base bipolar transistor and a transconductance stage bipolar transistor, wherein the emitter of the common-base bipolar transistor is directly connected to the collector of the transconductance stage bipolar transistor, wherein the conduction path of the first transistor includes an inductive load, wherein the first variable capacitor and the inductive load are directly connected to the collector of the common-base bipolar transistor, wherein the transconductance linearizing element includes an inductor element, and wherein the second variable capacitor and the inductor element are directly connected to the emitter of the transconductance stage bipolar transistor.

10. The amplifier circuit of claim 9, wherein the matching network only includes an inductor and a capacitor.

11. The amplifier circuit of claim 10, wherein the inductor, the second variable capacitor and the inductor element are directly coupled to the same reference voltage.

12. The amplifier circuit of claim 11, wherein the capacitor is directly coupled to the base of the transconductance stage bipolar transistor.

13. The amplifier circuit of claim 12 further comprising a resistor coupled in parallel with the first variable capacitor and the inductor element.

14. The amplifier circuit of claim 12 further comprising a second capacitor, wherein the second capacitor is directly coupled to the resistor, the first variable capacitor, the inductor element and the collector of the common-base bipolar transistor.

15. The amplifier circuit of claim 14, wherein the wide frequency range is between 4.9 gigahertz and 6 gigahertz.

16. The amplifier circuit of claim 15, wherein the substantially constant gain has a less than 1 decibel variation.

17. The method of claim 1, wherein the wide frequency range is between 4.9 gigahertz and 6 gigahertz.

18. The method of claim 17, wherein the substantially constant gain has a less than 1 decibel variation.

19. The amplifier circuit of claim 2, wherein the wide frequency range is between 4.9 gigahertz and 6 gigahertz.

20. The amplifier circuit of claim 19, wherein the substantially constant gain has a less than 1 decibel variation.

* * * * *